(12) United States Patent
Bertness et al.

(10) Patent No.: US 6,707,303 B2
(45) Date of Patent: Mar. 16, 2004

(54) ELECTRONIC BATTERY TESTER

(75) Inventors: Kevin I. Bertness, Batavia, IL (US); Jamey Butteris, Woodridge, IL (US)

(73) Assignee: Midtronics, Inc., Willowbrook, IL (US)

( * ) Notice: Subject to any disclaimer, the term of this patent is extended or adjusted under 35 U.S.C. 154(b) by 64 days.

(21) Appl. No.: 09/992,350

(22) Filed: Nov. 26, 2001

(65) Prior Publication Data

US 2002/0130665 A1 Sep. 19, 2002

Related U.S. Application Data

(62) Division of application No. 09/544,696, filed on Apr. 7, 2000, now Pat. No. 6,323,650.
(60) Provisional application No. 60/128,366, filed on Apr. 8, 1999.

(51) Int. Cl.⁷ .............................................. G01N 77/416
(52) U.S. Cl. ......................................... 324/426; 702/63
(58) Field of Search ................. 324/426, 425, 324/398; 702/63, 64

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

"Alligator Clips with Wire Penetrators" *J.S. Popper, Inc.* product information, downloaded from http://www.jspopper.com/, undated, no date.

"#12: LM78S40 Simple Switcher DC to DC Converter", *ITM e–Catalog*, downloaded from http://www.pcbcafe.com, undated, no date.

"Simple DC–DC Converts Allows Use of Single Battery", *Electronix Express*, downloaded from http://www.elexp.com/t_dc–dc.htm, undated, no date.

(List continued on next page.)

*Primary Examiner*—Rajnikant B. Patel
(74) *Attorney, Agent, or Firm*—Westman, Champlin & Kelly, P.A.

(57) ABSTRACT

An electronic battery tester includes a calibration interface. A microprocessor is configured to calibrate the battery tester by coupling to a calibrator through the calibration interface.

33 Claims, 3 Drawing Sheets

U.S. PATENT DOCUMENTS

| | | |
|---|---|---|
| 3,593,099 A | 7/1971 | Scholl .................. 320/13 |
| 3,607,673 A | 9/1971 | Seyl ..................... 204/1 |
| 3,676,770 A | 7/1972 | Sharaf et al. ........ 324/29.5 |
| 3,729,989 A | 5/1973 | Little ................... 73/133 |
| 3,753,094 A | 8/1973 | Furuishi et al. ...... 324/29.5 |
| 3,808,522 A | 4/1974 | Sharaf .................. 324/29.5 |
| 3,811,089 A | 5/1974 | Strezelewicz ........ 324/170 |
| 3,873,911 A | 3/1975 | Champlin .............. 324/29.5 |
| 3,876,931 A | 4/1975 | Godshalk .............. 324/29.5 |
| 3,886,443 A | 5/1975 | Miyakawa et al. ... 324/29.5 |
| 3,889,248 A | 6/1975 | Ritter ................... 340/249 |
| 3,906,329 A | 9/1975 | Bader ................... 320/44 |
| 3,909,708 A | 9/1975 | Champlin .............. 324/29.5 |
| 3,936,744 A | 2/1976 | Perlmutter ............ 324/29.5 |
| 3,946,299 A | 3/1976 | Christianson et al. ... 320/43 |
| 3,947,757 A | 3/1976 | Grube et al. .......... 324/28 |
| 3,969,667 A | 7/1976 | McWilliams ........... 324/29.5 |
| 3,979,664 A | 9/1976 | Harris .................. 324/17 |
| 3,984,762 A | 10/1976 | Dowgiallo, Jr. ....... 324/29.5 |
| 3,984,768 A | 10/1976 | Staples ................. 324/62 |
| 3,989,544 A | 11/1976 | Santo ................... 429/61 |
| 4,008,619 A | 2/1977 | Alcaide et al. ........ 73/398 |
| 4,047,091 A | 9/1977 | Hutchines et al. .... 363/59 |
| 4,053,824 A | 10/1977 | Dupuis et al. ......... 324/29.5 |
| 4,070,624 A | 1/1978 | Taylor .................. 327/158 |
| 4,086,531 A | 4/1978 | Bernier ................ 324/158 |
| 4,112,351 A | 9/1978 | Back et al. ........... 324/16 |
| 4,114,083 A | 9/1978 | Benham et al. ....... 320/39 |
| 4,126,874 A | 11/1978 | Suzuki et al. ......... 354/60 |
| 4,178,546 A | 12/1979 | Hulls et al. ........... 324/158 |
| 4,193,025 A | 3/1980 | Frailing et al. ........ 324/427 |
| 4,207,611 A | 6/1980 | Gordon ................. 364/580 |
| 4,217,645 A | 8/1980 | Barry et al. ........... 364/483 |
| 4,297,639 A | 10/1981 | Branham .............. 324/429 |
| 4,315,204 A | 2/1982 | Sievers et al. ........ 322/28 |
| 4,316,185 A | 2/1982 | Watrous et al. ....... 340/636 |
| 4,322,685 A | 3/1982 | Frailing et al. ........ 324/429 |
| 4,351,405 A | 9/1982 | Fields et al. .......... 180/65 |
| 4,361,809 A | 11/1982 | Bil et al. ............... 324/426 |
| 4,363,407 A | 12/1982 | Barkler et al. ........ 209/3.3 |
| 4,369,407 A | 1/1983 | Korbell ................. 324/416 |
| 4,379,989 A | 4/1983 | Kurz et al. ............ 320/26 |
| 4,379,990 A | 4/1983 | Sievers et al. ........ 322/99 |
| 4,390,828 A | 6/1983 | Converse et al. ...... 320/32 |
| 4,392,101 A | 7/1983 | Saar et al. ............. 320/20 |
| 4,396,880 A | 8/1983 | Windebank ........... 320/21 |
| 4,408,157 A | 10/1983 | Beaubien .............. 324/62 |
| 4,412,169 A | 10/1983 | Dell 'Orto ............ 320/64 |
| 4,423,378 A | 12/1983 | Marino et al. ........ 324/427 |
| 4,423,379 A | 12/1983 | Jacobs et al. .......... 324/429 |
| 4,424,491 A | 1/1984 | Bobbett et al. ....... 324/433 |
| 4,459,548 A | 7/1984 | Lentz et al. ........... 324/158 |
| 4,514,694 A | 4/1985 | Finger .................. 324/429 |
| 4,520,353 A | 5/1985 | McAuliffe ............. 340/636 |
| 4,564,798 A | 1/1986 | Young .................. 320/6 |
| 4,633,418 A | 12/1986 | Bishop ................. 364/554 |
| 4,659,977 A | 4/1987 | Kissel et al. .......... 320/64 |
| 4,663,580 A | 5/1987 | Wortman .............. 320/35 |
| 4,665,370 A | 5/1987 | Holland ................ 324/429 |
| 4,667,143 A | 5/1987 | Cooper et al. ........ 320/22 |
| 4,667,279 A | 5/1987 | Maier ................... 363/46 |
| 4,678,998 A | 7/1987 | Muramatsu ........... 324/427 |
| 4,679,000 A | 7/1987 | Clark ................... 324/428 |
| 4,680,528 A | 7/1987 | Mikami et al. ........ 320/32 |
| 4,697,134 A | 9/1987 | Burkum et al. ....... 320/48 |
| 4,707,795 A | 11/1987 | Alber et al. ........... 364/550 |
| 4,709,202 A | 11/1987 | Koenck et al. ........ 320/43 |
| 4,710,861 A | 12/1987 | Kanner ................. 363/46 |
| 4,719,428 A | 1/1988 | Liebermann .......... 324/436 |
| 4,743,855 A | 5/1988 | Randin et al. ........ 324/430 |
| 4,745,349 A | 5/1988 | Palanisamy et al. ... 320/22 |
| 4,816,768 A | 3/1989 | Champlin .............. 324/428 |
| 4,820,966 A | 4/1989 | Fridman ............... 320/32 |
| 4,825,170 A | 4/1989 | Champlin .............. 324/436 |
| 4,847,547 A | 7/1989 | Eng, Jr. et al. ....... 320/35 |
| 4,849,700 A | 7/1989 | Morioka et al. ....... 324/427 |
| 4,876,495 A | 10/1989 | Palanisamy et al. ... 320/18 |
| 4,881,038 A | 11/1989 | Champlin .............. 324/426 |
| 4,912,416 A | 3/1990 | Champlin .............. 324/430 |
| 4,913,116 A | 4/1990 | Katogi et al. ......... 123/425 |
| 4,929,931 A | 5/1990 | McCuen ................ 340/636 |
| 4,931,738 A | 6/1990 | MacIntyre et al. .... 324/435 |
| 4,937,528 A | 6/1990 | Palanisamy ........... 324/430 |
| 4,947,124 A | 8/1990 | Hauser ................. 324/430 |
| 4,956,597 A | 9/1990 | Heavey et al. ........ 320/14 |
| 4,968,941 A | 11/1990 | Rogers ................. 324/428 |
| 4,968,942 A | 11/1990 | Palanisamy ........... 324/430 |
| 5,004,979 A | 4/1991 | Marino et al. ........ 324/160 |
| 5,032,825 A | 7/1991 | Xuznicki ............... 340/636 |
| 5,037,778 A | 8/1991 | Stark et al. ........... 437/216 |
| 5,047,722 A | 9/1991 | Wurst et al. .......... 324/430 |
| 5,087,881 A | 2/1992 | Peacock ............... 324/378 |
| 5,095,223 A | 3/1992 | Thomas ................ 307/110 |
| 5,126,675 A | 6/1992 | Yang .................... 324/435 |
| 5,140,269 A | 8/1992 | Champlin .............. 324/433 |
| 5,144,218 A | 9/1992 | Bosscha ................ 320/44 |
| 5,144,248 A | 9/1992 | Alexandres et al. ... 324/428 |
| 5,160,881 A | 11/1992 | Schramm et al. ..... 322/7 |
| 5,170,124 A | 12/1992 | Blair et al. ............ 324/434 |
| 5,179,335 A | 1/1993 | Nor ...................... 320/21 |
| 5,194,799 A | 3/1993 | Tomantschger ....... 320/2 |
| 5,204,611 A | 4/1993 | Nor et al. .............. 320/21 |
| 5,214,370 A | 5/1993 | Harm et al. ........... 320/35 |
| 5,214,385 A | 5/1993 | Gabriel et al. ........ 324/434 |
| 5,241,275 A | 8/1993 | Fang ..................... 324/430 |
| 5,254,952 A | 10/1993 | Salley et al. .......... 324/429 |
| 5,266,880 A | 11/1993 | Newland ............... 320/14 |
| 5,281,919 A | 1/1994 | Palanisamy ........... 324/427 |
| 5,281,920 A | 1/1994 | Wurst ................... 324/430 |
| 5,295,078 A | 3/1994 | Stich et al. ............ 364/483 |
| 5,298,797 A | 3/1994 | Redl ..................... 307/246 |
| 5,300,874 A | 4/1994 | Shimamoto et al. ... 320/15 |
| 5,302,902 A | 4/1994 | Groehl .................. 324/434 |
| 5,315,287 A | 5/1994 | Sol ....................... 340/455 |
| 5,321,626 A | 6/1994 | Palladino .............. 364/483 |
| 5,331,268 A | 7/1994 | Patino et al. .......... 320/20 |
| 5,336,993 A | 8/1994 | Thomas et al. ........ 324/158.1 |
| 5,338,515 A | 8/1994 | Dalla Betta et al. ... 422/95 |
| 5,339,018 A | 8/1994 | Brokaw ................ 320/35 |
| 5,343,380 A | 8/1994 | Champlin .............. 363/46 |
| 5,347,163 A | 9/1994 | Yoshimura ............ 307/66 |
| 5,352,968 A | 10/1994 | Reni et al. ............. 320/35 |
| 5,365,160 A | 11/1994 | Leppo et al. .......... 320/22 |
| 5,365,453 A | 11/1994 | Startup et al. ......... 364/481 |
| 5,381,096 A | 1/1995 | Hirzel .................. 324/427 |
| 5,412,323 A | 5/1995 | Kato et al. ............ 324/429 |
| 5,426,371 A | 6/1995 | Salley et al. .......... 324/429 |
| 5,426,416 A | 6/1995 | Jefferies et al. ....... 340/664 |
| 5,432,426 A | 7/1995 | Yoshida ................ 320/20 |
| 5,434,495 A | 7/1995 | Toko .................... 320/44 |
| 5,435,185 A | 7/1995 | Eagan .................. 73/587 |
| 5,442,274 A | 8/1995 | Tamai ................... 320/23 |
| 5,445,026 A | 8/1995 | Eagan .................. 73/591 |
| 5,449,996 A | 9/1995 | Matsumoto et al. ... 320/20 |
| 5,449,997 A | 9/1995 | Gilmore et al. ....... 320/39 |
| 5,451,881 A | 9/1995 | Finger .................. 324/433 |
| 5,457,377 A | 10/1995 | Jonsson ................ 320/5 |
| 5,469,043 A | 11/1995 | Cherng et al. ........ 320/31 |
| 5,485,090 A | 1/1996 | Stephens .............. 324/433 |
| 5,488,300 A | 1/1996 | Jamieson .............. 324/432 |
| 5,519,383 A | 5/1996 | De La Rosa .......... 340/636 |

| | | | |
|---|---|---|---|
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 4,024,953 A | 5/1997 | Nailor, III | 206/344 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,796,239 A | 8/1998 | Van Phuoc et al. | 320/107 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.5 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,363,303 B1 | 3/2002 | Bertness | 701/29 |
| 6,384,608 B1 | 5/2002 | Namaky | 324/425 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |

OTHER PUBLICATIONS

"DC–DC Converter Basics", *Power Designers*, downloaded from http://www.powederdesigners.com/InforWeb.design_center/articles/DC–DC/converter.shtm, undated, no date.

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hapson et al., *Journal of Applied Electrochemistry*, 1980, pp. 3–11, no date.

"A Package for Impedance/Admittance Data Analysis", by B. Boukamp, *Solid State Ionics*, 1986, pp. 136–140, no date.

"Precision of Impedance Spectroscopy Estimates of Bulk, Reaction Rate, and Diffusion Parameters", by J. Macdonald et al., *J. Electroanal, Chem.*, 1991, pp. 1–11.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–$4^{th}$–Order Elliptic Notch Filter", 12/94, RRD–B30M115, Dec. 1994.

ELECTRONIC BATTERY TESTER

The present invention is a division of Ser. No. 09/544,696 filed Apr. 7, 2000 now U.S. Pat. No. 6,323,650, which claims priority to Provisional Application Serial No. 60/128,366, filed Apr. 8, 1999 and entitled ELECTRONIC BATTERY TESTER.

BACKGROUND OF THE INVENTION

The present invention relates to testing of storage batteries. More specifically, the present invention relates to electronic battery testers of the type used to test the condition of storage batteries.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. of Burr Ridge, Ill. for testing storage batteries by measuring the conductance of the batteries. This technique is described in a number of United States patents obtained by Dr. Champlin and Midtronics, Inc, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; and U.S. Pat. No. 6,002,238, issued Dec. 14, 1999, entitled METHOD AND APPARATUS FOR MEASURING COMPLEX IMPEDANCE OF CELLS AND BATTERIES.

Most accurate electronic battery testers have required very accurate and relatively expensive test and interface circuitry. The circuitry must be able to be accurately calibrated to a standard, and maintain that calibration in the harsh environment often associate with automotive battery testing. The user interface associated with such devices has also been relatively complex and expensive. Such devices have required a significant capital investment and, because of this investment, have often not been attractive to individual consumers. Further, the expense associated with such battery testers has reduced the number of testers which are typically available in commercial settings.

SUMMARY OF THE INVENTION

An electronic battery tester includes a calibration interface. A microprocessor is configured to calibrate the battery tester by coupling to a calibrator through the calibration interface.

DETAILED DESCRIPTION OF THE PREFERRED EMBODIMENTS

The present invention provides an inexpensive electronic battery tester which delivers accurate results and is easy to use. Aspects of the invention will be apparent in the following disclosure.

Figure 1:
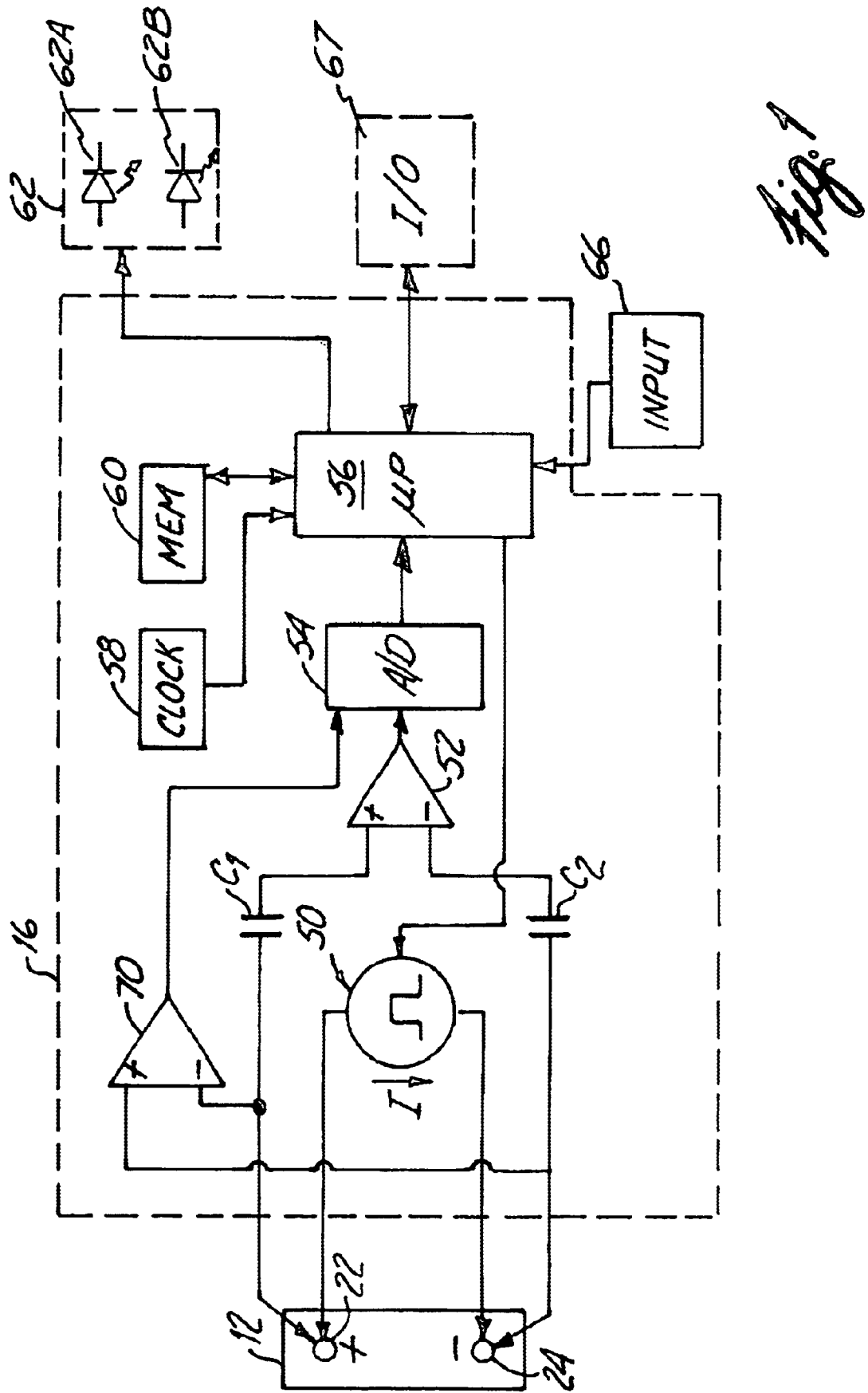
FIG. 1 is a simplified schematic diagram showing an electronic battery tester in accordance with the present invention.

FIG. 1 is a simplified block diagram of electronic battery tester circuitry 16 in accordance with the present invention. Apparatus 16 is shown coupled to battery 12 which includes a positive battery terminal 22 and a negative battery terminal 24. Battery 12 is a storage battery having a plurality of individual cells, typically six, and a voltage of 12.6 volts.

Circuitry 16 operates in accordance with one embodiment of the present invention and determines the conductance ($G_{BAT}$) of battery 12 and the voltage potential ($V_{BAT}$) between terminals 22 and 24 of battery 12. Circuitry 16 includes current source 50, differential amplifier 52, analog-to-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, visual output 62 and analog-to-digital converter 54. Microprocessor 56 is also capable of receiving an input from input device 66. Further, an input/output (I/O) port 67 is provided.

In operation, current source 50 is controlled by microprocessor 56 and provides a current in the direction shown by the arrow in FIG. 1 In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the dynamic conductance of battery 12 using the following equation:

$$\text{Conductance} = G_{BAT} = \frac{\Delta I}{\Delta V} \quad \text{Equation 1}$$

where $\Delta I$ is the change in current flowing through battery 12 due to current source 50 and $\Delta V$ is the change in battery voltage due to applied current $\Delta I$. This can then be converted in to cold cranking amps (CCA) and/or compared to a rating of battery 12 stored in memory 60.

One aspect of the present invention includes the reduction in the number of expensive components which are used in the battery tester 16. For example, some prior art battery testers have required a user input through which an operator enters a rating or reference for the particular battery being tested. However, in one embodiment, the present invention uses a fixed reference which is chosen to approximate the capacity of most batteries being tested. For example, a value of approximately 500 CCA may be used as an approximation and stored in memory 60. Although this reduces accuracy of the tester, the tester is still capable of providing satisfactory results for many applications. For example, if a battery is measured as being marginal, the operator can proceed with a battery test using a tester having a separate input. The particular general reference standard which is used in the present invention can be selected for a specific use for the tester. For example, if the tester is intended for use with automotive batteries one standard may be used and if the tester is intended for use with golf carts, for example, another standard may be stored in memory 60 during manufacture. In another embodiment, the rating is entered through input 66 by an operator.

In another aspect of the present invention, indicator 62 comprises two LEDs 62A and 62B. For example, LED 62A can be a red LED and LED 62B can be a green LED. If microprocessor 56 turns both LEDs 62A and 62B on, this indicator that the testing process is under way. A single green LED 62B indicates a good battery while a single red LED 62A indicates a bad battery. A flashing green LED 62B indicates a good battery with a low charge. Flashing red and green LEDs 62A,B indicate the battery should be recharged and retested. In another aspect, the tester 16 can be used as a charging tester by measuring the voltage across the battery 12 during operation of the engine of the vehicle which contains the battery. The tester can be switched between a battery test mode and a charging test mode through user input 66 which comprises a switch, for example. In this aspect of the invention, a green light indicates a normal charging voltage, a red light indicates a low charging voltage and a flashing red light indicates a high charging voltage of course, other combinations of light colors, sequences or flashing rates can be used to convey information.

In one aspect, memory 60 includes a non-volatile memory such as a flash memory which can store information when circuitry 16 is not receiving power. In performing a battery test, microprocessor can compare a measured value of a dynamic parameter of the battery, such as conductance, to a rated value to obtain a relative value. The rated value can be stored in memory 60. The units of the rating such as CCA, DIN, SAE, JIS or others, can be selected by a user and semi-permanently stored in the flash memory. Any type of non-volatile memory which can be written to and can be used. A rating can be selected through user input 66. For example, a first button can be used to increment a rating displayed on indicator 62 and a second button can be used to decrement the rating. The value of the increments and decrements can be stored in the flash memory. Programming of the flash memory can be through a special operating mode. For example, if a certain sequence of inputs are provided or pressed on input 66 during operation or during power up of the device, microprocessor 56 can enter a flash memory programming mode. In such a mode, the rating standard or the increment/decrement value can be entered and stored into the flash memory. Typically, circuitry 16 is powered using power derived from battery 12. In such an embodiment, values in the flash memory will be maintained even when the device is disconnected from battery 12.

Microprocessor 56 can also capture and store voltages measured by amplifier 70. For example, microprocessor 56 can take a number of samples using the analog to digital converter 54 and store a high sample value and a low sample value. These values can subsequently be retrieved using input 66 and displayed through indicator 62. This information is particularly useful to diagnose problems associated with the starter motor of the vehicle. For example, a relatively low voltage value can indicate a impending failure. Similarly, a high value during which the starter motor is not operating can indicate that the starter motor is burned out is failing to receive power.

In one aspect, indicator 62 includes an LED array configured to provide a numerical output. Such an output can provide, for example, a voltage measurement. Further, in one embodiment, an operator is able to enter the rating of a battery, such as a CCA rating, by pushing buttons in user input 66 which allow the operator to scroll through a series of CCA ratings which are displayed on the LED array of indicator 62. CCA can be stored in increments of 5 or 10, for example, and the operator can scroll through the increments until the battery rating is reached. A test can then be initiated by pressing another button in input 66.

Figure 2:
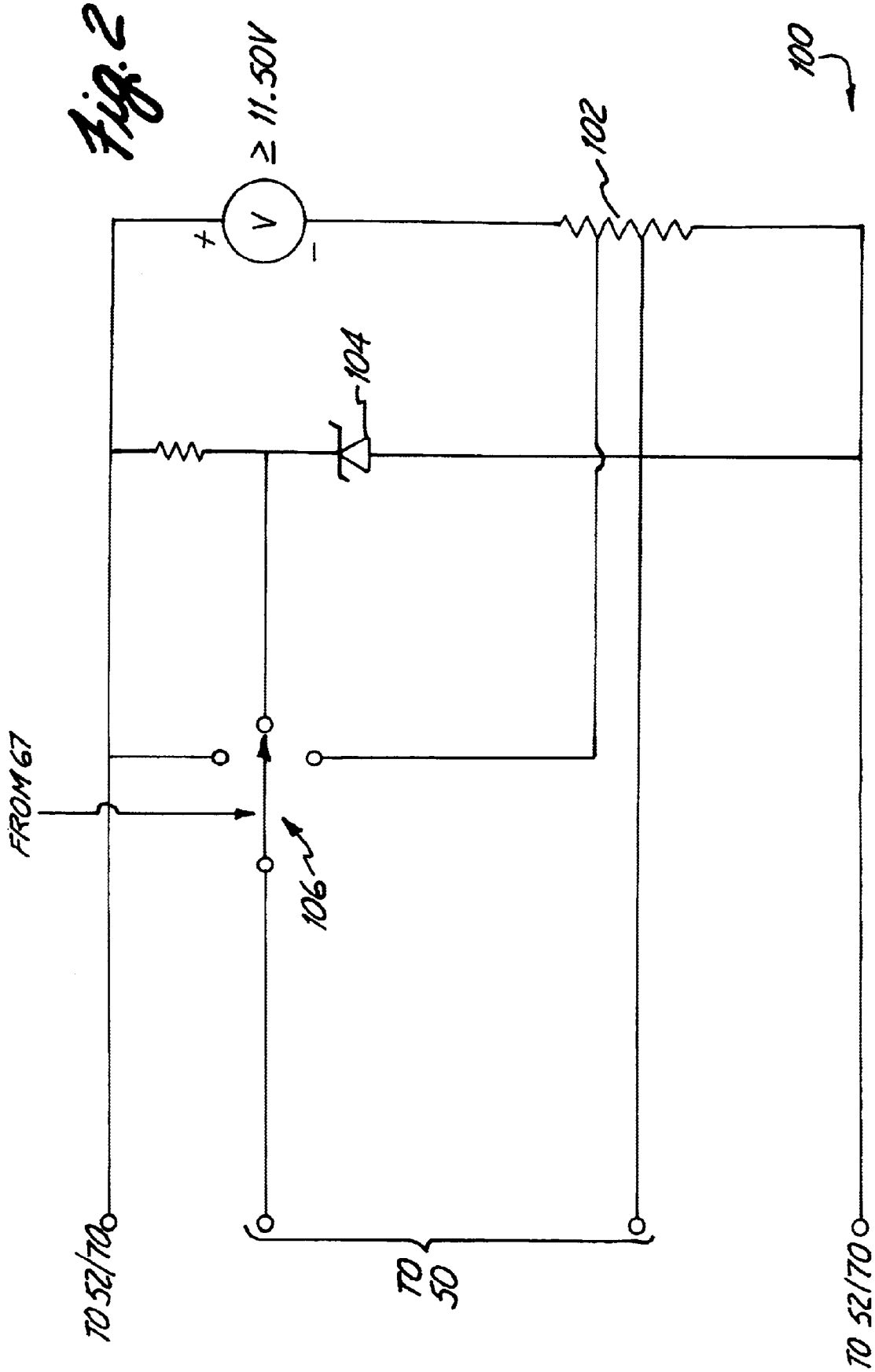
FIG. 2 is a simplified block diagram of a test fixture in accordance with one aspect of the invention for use with the battery tester of FIG. 1.

The battery tester 16 of the present invention is also capable of performing an automated calibration. Typically, this calibration is performed during manufacture, during which time the tester 16 is coupled to a calibrated test fixture. FIG. 2 is a simplified diagram of a test fixture or calibrator 100 for use with tester 16 of FIG. 1. In the simplified schematic diagram illustrated in FIG. 2, calibrator 100 includes a calibration resistance or shunt 102 and a calibration voltage generated by zener diode 104 of 10.00 volts. A switch 106 is connected as shown in FIG. 2 and coupled to tester I/O 67. During operation, microprocessor 56 and tester 16 controls switch 106 to switch between a conductance (CCA) calibration mode and a voltage calibration mode. To calibrate conductance, switch 106 is moved into position to couple to resistance 102. Tester 16 performs a test upon this calibration resistance 102. The difference between the measured value and the actual value is stored in memory 60 and is used to offset subsequent tests. Similarly, to perform a voltage calibration switch 106 is connected to voltage source 104 such that all test connections to tester 16 are connected across voltage source 104. Again, the measured value is compared to the actual value of source 104 and the offset is stored in memory 60 and used to correct subsequent calibrations. In a third position, switch 106 couples to the other terminal to allow measurement of the voltage source. After the calibration sequence, a second calibration sequence is performed. If errors still exist, or if the errors are outside of an acceptable window, the tester is rejected. Further I/O 67 can couple to a computer (not shown) whereby microprocessor 56 in tester can provide detailed diagnostic information such as specific calibration values or measurement errors for use in performing diagnostics on tester 16.

Calibrator 200 can have other configurations and the embodiment of FIG. 2 is simply one example. The switch can be formed by a relay transistor or other selectable switch and can comprise multiple switches to achieve the desired functionality. The calibrator can also include a microprocessor to perform more complex calibration steps.

Figure 3:
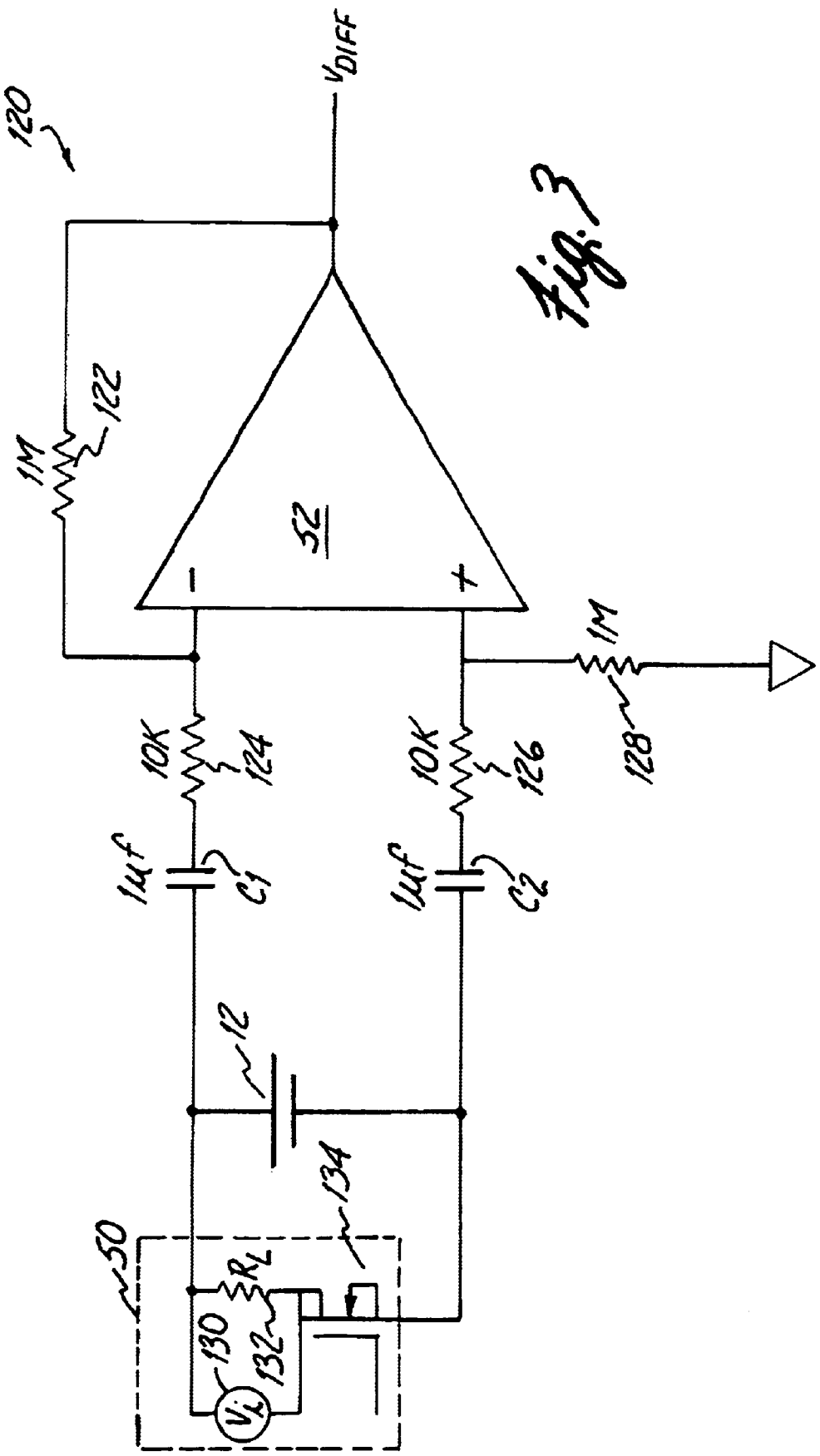
FIG. 3 is a simplified electrical schematic diagram of an amplifier in the tester of FIG. 1.

FIG. 3 illustrates a simplified amplifier 120 in accordance with another aspect of the invention. Amplifier 120 includes differential amplifier 52 coupled with resistors 122, 124, 126 and 128 as shown. Further, current source 50 is illustrated in FIG. 3 including a measured voltage $V_I$ 130 across a load resistance 132 which is switched by transistor 134. The amplifier is configured to have a gain of 100 and the transistor 134 switches at a frequency of 100 Hz. Thus, the CCA of the battery 12 is proportional to the conductance of the battery ($G_{BATT}$) which equals $V_I/V_{DIFF}$, where $V_I$ is the voltage across load resistance 132 and $V_{DIFF}$ is the differential voltage output from amplifier 52. In one preferred embodiment, amplifier 52 comprises a LM324 operational amplifier (OPAMP).

The present invention may be implemented using any appropriate technique. For simplicity, a single technique has been illustrated herein. However, other techniques may be used including implementation in all analog circuitry. Additionally, by using appropriate techniques, the battery resistance and a reference resistance (the reciprocal of conductance) may be employed in the invention. Various reference values may be stored in memory and be selected for various testing criteria such as based upon a measured temperature or the measured battery voltage. Although circuitry 16 has been illustrated in which source 50 is a current source and amplifier 52 measures a voltage signal, those skilled in the art will recognize that the circuitry may be modified by using a voltage signal source and detecting the result in current flowing through the battery. A value related to this current level is digitized and provided to the microprocessor. Battery conductance and relative conductance are calculated as appropriate. Further, the voltage or current signals may be pulsed, square waves, sign waves or any other appropriate signal controlled by microprocessor 56 or by an oscillator such as clock 58. The terms "inject" or "apply" is used herein to describe the applying of voltage or current either with active circuitry or by applying a load to the battery. Further, "time varying" includes step signal inputs, pulse signals, periodic signals, etc.

Although the present invention has been described with reference to preferred embodiments, workers skilled in the art will recognize that changes may be made in form and detail without departing from the spirit and scope of the invention.

What is claimed is:

1. An electronic battery tester for testing a storage battery, comprising:
   a first pair of connectors configured to couple to a positive terminal of the battery;
   a second pair of connectors to couple to a negative terminal of the battery, the first and second pairs of connectors forming a Kelvin connection with the battery;
   a non-volatile memory storing a fixed battery rating reference value;
   a microprocessor configured to test the battery through the Kelvin connection and based upon the fixed battery rating reference value stored in the memory, the microprocessor configured to provide an output based upon a measured dynamic parameter and the stored fixed battery rating reference value.

2. The electronic battery tester of claim 1 including calibration interface configured to calibrate the measured dynamic parameter.

3. The electronic battery tester of claim 1 including a visual output configured to display a result of the battery test, the visual output including an LED and wherein a first test result is indicated with the LED on and a second test result is indicated with the LED off.

4. The electronic battery tester of claim 1 wherein the fixed battery rating reference is selectable from a plurality of reference values.

5. The electronic battery tester of claim 4 wherein the fixed battery rating reference is selected from a scrolling list of a plurality of reference values.

6. The electronic battery tester of claim 4 wherein the fixed battery rating reference value is selected in accordance with an increment value stored in the memory.

7. The electronic battery tester of claim 6 wherein the increment value is stored in the non-volatile memory.

8. The electronic battery tester of claim 6 wherein the increment value is stored by placing the microprocessor in a programming mode.

9. The electronic battery tester of claim 8 wherein a programming mode is entered during power-up of the microprocessor.

10. The electronic battery tester of claim 1 wherein the fixed battery rating reference value is in accordance with a selectable standard.

11. The electronic battery tester of claim 10 wherein the standard is stored in memory.

12. The electronic battery tester of claim 10 wherein the standard is stored by placing the microprocessor in a programming mode.

13. The electronic battery tester of claim 12 wherein the programming mode is entered during power-up of the microprocessor.

14. The electronic battery tester of claim 1 wherein the microprocessor can selectively measure a battery charging voltage.

15. The electronic battery tester of claim 1 wherein measured voltage extremes are stored in the memory.

16. The electronic battery tester of claim 1 including an LED and wherein a test result is displayed by displaying a selectable color from the LED.

17. The electronic battery tester of claim 1 including an LED and wherein a test result is displayed by flashing the LED.

18. The electronic battery tester of claim 1 wherein the fixed battery rating reference value comprises a CCA (Cold Cranking Amp) rating.

19. An electronic battery tester for testing a storage battery, comprising:
a first pair of connectors configured to couple to a positive terminal of the battery;
a second pair of connectors configured to couple to a negative terminal of the battery, the first and second pairs of connectors forming a Kelvin connection with the battery;
a memory;
a microprocessor configured to test the battery through the Kelvin connection based upon a reference;
a visual output configured to display a result of the battery test, the visual output including an LED and wherein a first test result is indicated with the LED on and a second test result is indicated with the LED off.

20. The electronic battery tester of claim 19 including a calibration interface configured to couple to a calibrator to initiate measurement of a calibrated value of the calibrator through the Kelvin connection.

21. The electronic battery tester of claim 19 wherein the battery test is a function of a fixed reference value stored in the memory.

22. The electronic battery tester of claim 19 wherein the battery test is further a function of a selectable reference value.

23. The electronic battery tester of claim 19 wherein the test is a function of a measured dynamic parameter.

24. An electronic battery tester for testing a storage battery, comprising:
a first pair of connectors configured to couple to a positive terminal of the battery;
a second pair of connectors configured to couple to a negative terminal of the battery, the first and second pairs of connectors forming a Kelvin connection with the battery;
a memory;
a microprocessor configured to test the battery through the Kelvin connection based upon a reference;
a visual output configured to display a result of the battery test, the visual output including an LED and wherein a first test result is indicated by displaying a first color on the LED and a second test result is indicated by displaying a second color on the LED.

25. The electronic battery tester of claim 24 including a calibration interface configured to couple to a calibrator to initiate measurement of a calibrate value of the calibrator through the Kelvin connection.

26. The electronic battery tester of claim 24 wherein the battery test is a function of a fixed reference value stored in the memory.

27. The electronic battery tester of claim 24 wherein the battery test is further a function of a selectable reference value.

28. The electronic battery tester of claim 24 wherein the test is a function of a measured dynamic parameter.

29. An electronic battery tester for testing a storage battery, comprising;
a first pair of connectors configured to couple to a positive terminal of the battery;
a second pair of connectors configured to couple to a negative terminal of the battery, the first and second pairs of connectors forming a Kelvin connection with the battery;
a memory;
a microprocessor configured to test the battery through the Kelvin connection based upon a battery rating and selectively test a charging voltage of a battery charger; and
a user input configured to select from a battery test and a charging voltage test.

30. The electronic battery tester of claim 29 including a visual output configured to display a result of a test, the visual output including a LED and wherein a first test result is indicated with the LED on and a second test result is indicated with the LED off.

31. An electronic battery tester for testing a storage battery, comprising:
a first pair of connectors configured to couple to a positive terminal of the battery;
a second pair of connectors configured to couple to a negative terminal of the battery, the first and second pairs of connectors forming a Kelvin connection with the battery;
a memory;
a calibration interface configured to provide a calibrator control output to a calibrator;
a microprocessor configured to test the battery through the Kelvin connection in the memory, wherein the microprocessor is placed in a programming mode which can be entered during power-up of the battery tester.

32. An electronic battery tester for testing a storage battery, comprising;
   a first pair of connectors configured to couple to a positive terminal of the battery;
   a second pair of connector configured to couple to a negative terminal of the battery, the first and second pairs of connectors forming a Kelvin connection with the battery;
   a non-volatile memory;
   a microprocessor configured to test the battery through the Kelvin connection based upon an industry standard battery rating; and
   wherein measured voltage extremes are stored in the memory for subsequent recovery.

33. The electronic battery tester of claim 32 wherein the battery test is a function of a dynamic parameter.

* * * * *

UNITED STATES PATENT AND TRADEMARK OFFICE
CERTIFICATE OF CORRECTION

PATENT NO. : 6,707,303 B2
DATED : March 16, 2004
INVENTOR(S) : Kevin I. Bertness It is certified that error appears in the above-identified patent and that said Letters Patent is hereby corrected as shown below:

Column 6,
Line 48, after "connectors" insert -- configured --.

Column 8,
Line 22, delete "calibrate" and insert -- calibrated --.
Line 65, after "connection" insert -- based upon a calibrated value stored --.

Column 9,
Line 5, delete "connector" and insert -- connectors --.

Signed and Sealed this

Twenty-first Day of September, 2004

JON W. DUDAS
*Director of the United States Patent and Trademark Office*